United States Patent [19]

Yokouchi et al.

[11] Patent Number: 4,680,491
[45] Date of Patent: Jul. 14, 1987

[54] CMOS DATA INPUT-OUTPUT CIRCUIT

[75] Inventors: Hiroshi Yokouchi; Kazuhiko Miyazaki, both of Tokyo, Japan

[73] Assignee: Oki Electric Industry Co., Ltd., Tokyo, Japan

[21] Appl. No.: 739,304

[22] Filed: May 29, 1985

[30] Foreign Application Priority Data

May 30, 1984 [JP] Japan ................... 59-108475

[51] Int. Cl.$^4$ ................... H03K 17/56; H03K 19/096; H03K 19/00
[52] U.S. Cl. ................... 307/579; 307/242; 307/452; 307/473; 365/189
[58] Field of Search ............ 307/451, 452, 473, 480, 307/481, 239, 242, 585, 579; 365/189, 233

[56] References Cited

U.S. PATENT DOCUMENTS 4,063,225 12/1977 Stewart ................... 307/473
4,479,067 10/1984 Fujita ................... 307/448

FOREIGN PATENT DOCUMENTS 0110774 8/1979 Japan ................... 307/473

OTHER PUBLICATIONS

"Microcontroller Handbook", Design Considerations When Using CHMOS, Chapter 10, Issued by INTEL 1983, (Refer to pp. 10-1 and 10-2).

Primary Examiner—Stanley D. Miller
Assistant Examiner—M. P. Wambach
Attorney, Agent, or Firm—Wenderoth, Lind & Ponack

[57] ABSTRACT

In a CMOS type input-output circuit having an input control circuit, an output control circuit, a buffer circuit, a CMOS output buffer circuit and an input buffer circuit, the input-output circuit being capable of bidirectional transmission of information between a data bus and an I/O port, improvements on the control circuit are embodied by selecting a gate circuit in the input control circuit corresponding to that in the output control circuit. The output control circuit is connected to the input control circuit and the CMOS output buffer circuit. The CMOS output buffer circuit is connected to the input control circuit and the I/O port. Upon inputting a signal to both control circuits, the output control circuit causes the CMOS output buffer circuit to be electrically floating; the input control circuit outputs a level fixing signal regardless of the logic level of the I/O port.

6 Claims, 8 Drawing Figures

CMOS DATA INPUT-OUTPUT CIRCUIT

BACKGROUND OF THE INVENTION

1. Field of the Invention

This invention relates to a complementary MOS data input-output (I/O) CMOS type input-output circuit, and more particularly to a CMOS data input-output circuit suitable for microprocessors.

2. Description of the Prior Art

CMOS input-output circuits are commonly used in CMOS microprocessors or CMOS microcomputers because they consume very little electrical power. Such CMOS input-output circuits include circuits capable of bidirectional transmission of information between an external circuit connected to an I/O port and an internal data bus.

The CMOS data input output circuit generally comprises a data output circuit which transmits information on a bit line of the internal data bus to an external circuit through the I/O port, and a data input circuit which transmits information from the external circuit to the bit line of the data bus through the I/O port.

An example of a conventional data input-output circuit including a CMOS output buffer is described in "MICRO-CONTROLLER HANDBOOK 1983 (INTEL, 1983 ed., Pages 10-1 and 10-2).

With such conventional input-output circuits, however, it is difficult to directly connect the I/O port to an external circuit the output logic state of an external circuit must be the same as the logic state of the I/O port, before these circuits are powered down. In a power down mode, these CMOS data input-output circuits should electrically isolate their internal data bus from the I/O port in order to avoid their effects of the external circuits attached thereto.

However, in this case, there is a disadvantage in that when the I/O port becomes open or high impedance, the data input circuit portion of the data I/O circuit consumes electrical power in spite of the power-down mode.

To avoid this power consumption problem, it is necessary to connect an external pull-up or pull-down resistor to the I/O port to fix the I/O port at an H or L logic level. However, the external resistor is troublesome in that it requires handling and occupies additional mounting space.

As described above, in the conventional CMOS data I/O circuit, it has been difficult to simultaneously satisfy three requirements: no special means for interfacing an I/O port and an external circuit; low operational power consumption in a power-down mode; elimination of external pull-up or pull-down resistors. It has been strongly desired to obtain an improved CMOS data I/O circuit which can solve the contradictionary problems.

SUMMARY OF THE INVENTION

One object of the present invention is to provide a CMOS data input-output circuit which consumes very little electrical power in a power down mode of a microprocessor.

It is another object of the present invention to provide a CMOS type data input-output circuit which requires no external pull-up or pull-down resistors for preventing its I/O port from floating.

A CMOS data input-output circuit according to the present invention controls the bidirectional transmission of information between a data bus and an I/O port and comprises a memory means connected to a bit line of the data bus for temporarily receiving information on the bit line of the data bus in response to a write signal; a CMOS output buffer means including a serially connected P-MOS transistor and N-MOS transistor, the P-MOS transistor having a gate and having a source connected to a power source and having a drain connected to the I/O port, the N-MOS transistor having a gate and having a source connected to ground and having a drain connected to the I/O port; an output control means having an output connected to the output of the memory means, a first output connected to the gate of the P-MOS transistor of the CMOS output-buffer means and a second output connected to the gate of the N-MOS transistor of the CMOS output buffer means, and for receiving a control signal to place the I/O port in an electrically floating condition; an input buffer means having an input and an output connected to the bit line of the data bus for selectively transmitting information on the I/O port to the bit line of the data bus in response to a read signal; and an input control means having an output connected to the input of the input buffer means, a first input connected to the I/O port and second input for receiving the control signal; wherein the output of the input control means is fixed at a predetermined logic level when the control signal is inputted to the second input of the input control means in a power-down operation.

DESCRIPTION OF THE PREFERRED EMBODIMENT

Figure 2:
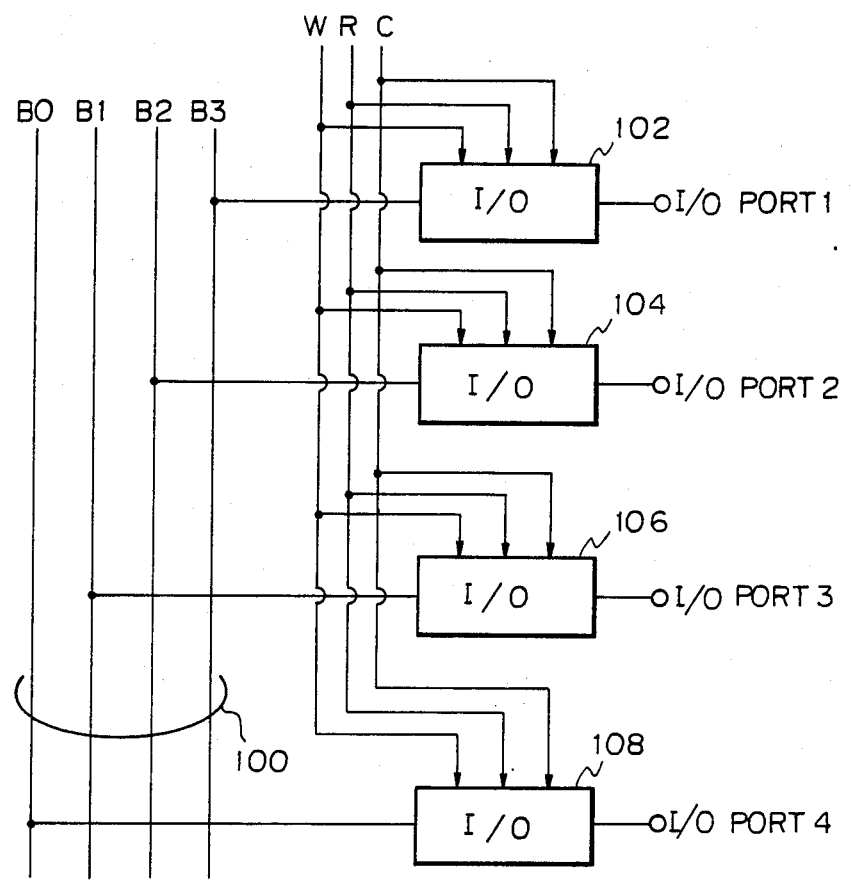
FIG. 2 is a block diagram of a CMOS input-output port circuit including a plurality of a CMOS data input-output circuits according to the present invention.
Figure 3:
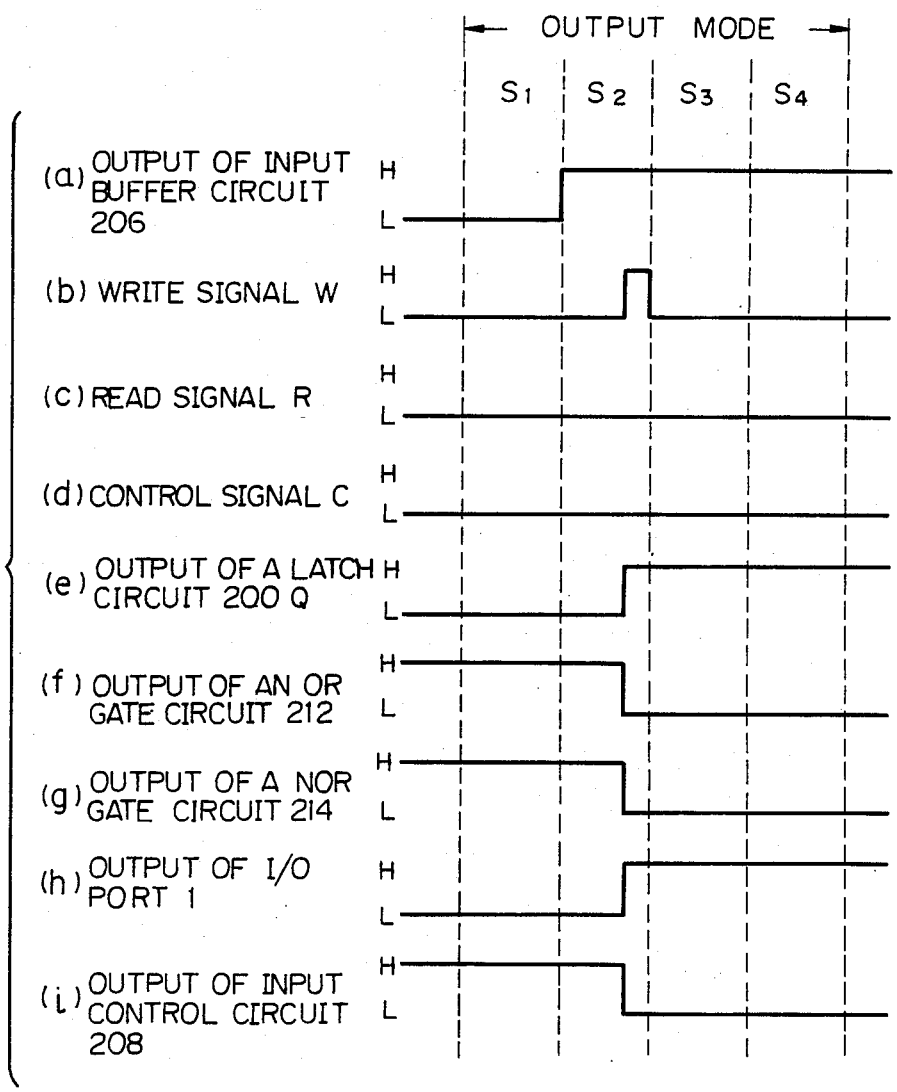
FIGS. 3(a)-(i) are timing diagrams used to explain the operation of the data output mode of the circuit of FIG. 1.
Figure 4:
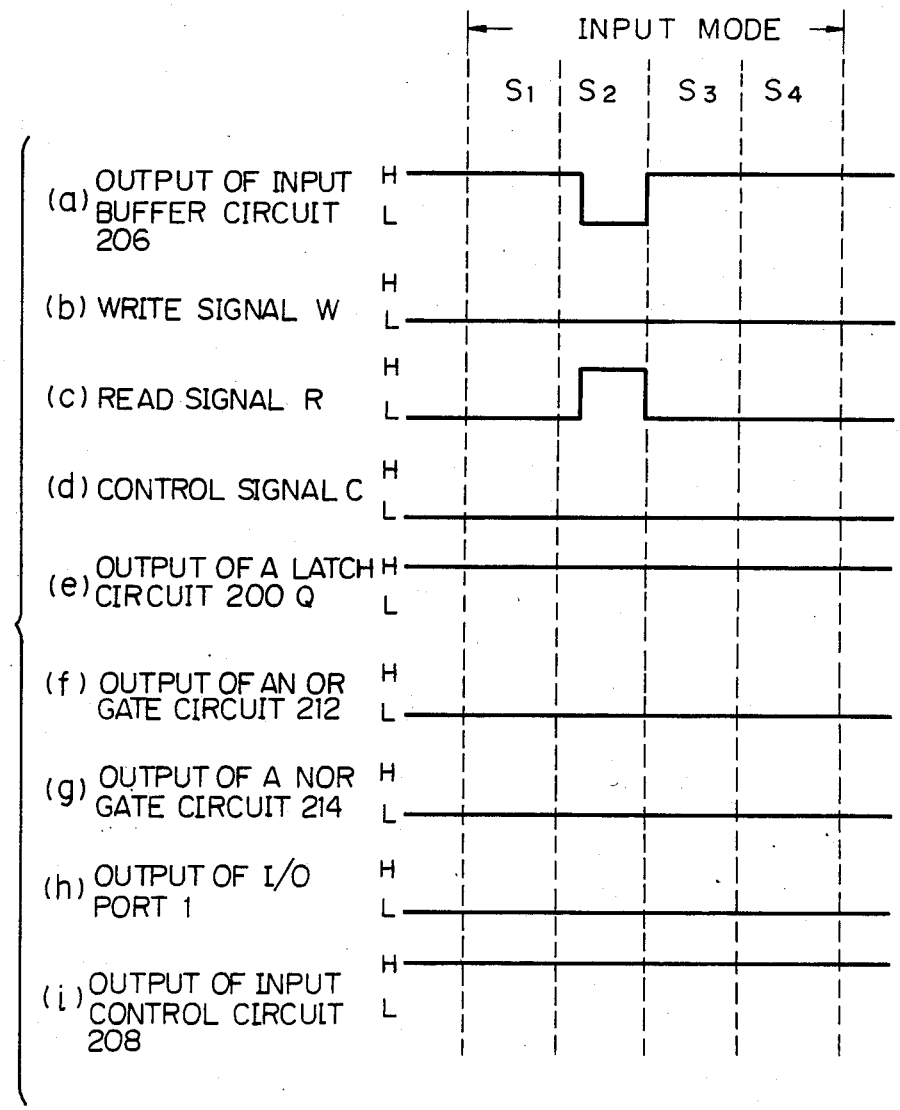
FIGS. 4(a)-(i) are timing diagrams used to explain the operation of the data input mode of the circuit of FIG. 1.
Figure 5:
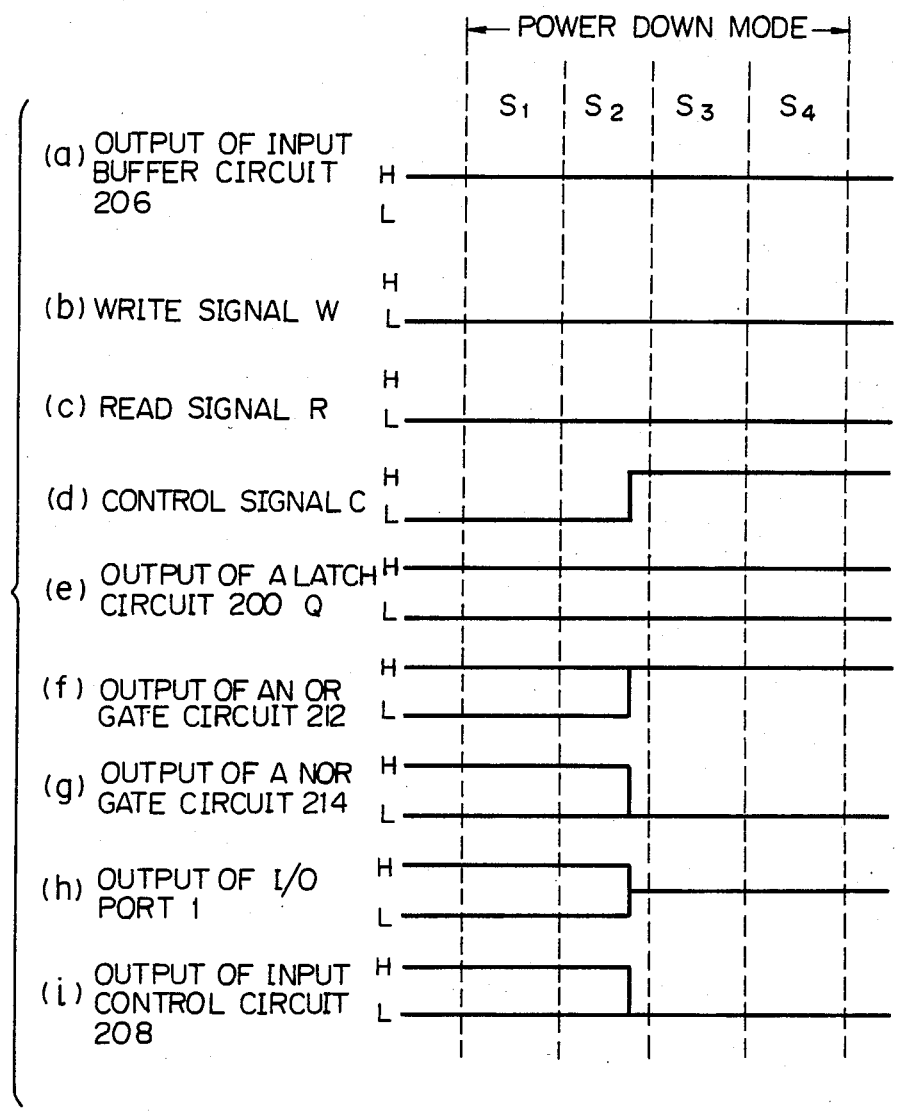
FIGS. 5(a)-(i) are timing diagrams used to explain the operation of the power down mode of the circuit of FIG. 1.

FIG. 2 shows a CMOS data input-output port circuit connected to a data bus in a microprocessor or microcomputer and comprising of a plurality of CMOS data input-output circuits according to the present invention.

In FIG. 2, the CMOS data input-output circuits 102, 104, 106 and 108 are respectively connected to bit lines B3, B2, B1, and B0 of an internal data bus of a microprocessor (not shown). The CMOS data input-output circuit selectively receives a write signal W, a read signal R and a control signal C. The input-output terminals of the CMOS data I/O circuits 102, 104, 106 and 108 are respectively connected to I/O ports 1, 2, 3 and 4. The CMOS data I/O circuit transmits information on the data bus 100 to the I/O port when a write signal W is supplied thereto, and transmits information on the I/O port to the data bus 100 when a read signal R is supplied thereto.

In a power-down mode of a microprocessor, when a control signal C is applied to the CMOS data I/O circuits 102, 104, 106 and 108, the I/O ports 1, 2, 3 and 4 become electrically floating (i.e.—an open circuit), while the output levels of the input control circuits in the CMOS data I/O circuits described later are fixed at a logic L level, for example. As a result, each of the input control circuits inhibits its on and off operation even if an output level at the I/O port fluctuates. This allows the CMOS data I/O circuit to have a lower operational power consumption in the power-down mode.

Figure 1:
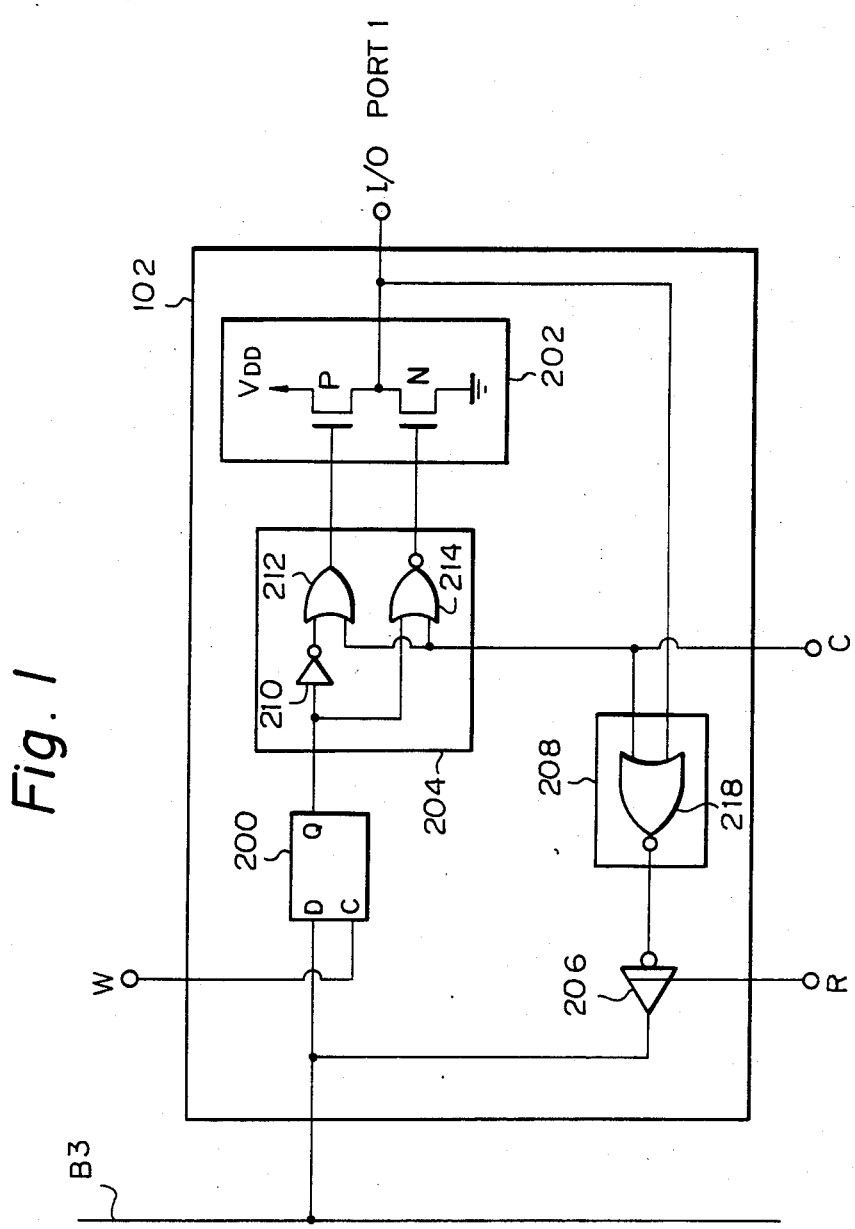
FIG. 1 is a block diagram of a CMOS data input-output circuit according to the present invention.

FIG. 1 shows a preferred embodiment of such a CMOS type input-output circuit in accordance with the present invention. The CMOS data input-output circuit 102 comprises a latch circuit 200 acting as a memory means, a CMOS output buffer circuit 202, an output control circuit 204, an input buffer circuit 206, and an input control circuit 208. The latch circuit 200 temporarily stores a signal of the bit line B3 of the data bus 100 (not shown in FIG. 1) when a write signal W is inputted thereto, the output thereof immediately representing the stored signal. The CMOS output buffer circuit 202 comprises PMOS and NMOS transistors, the output of which is connected to the I/O port 1. The output control circuit 204 transmits the output signal of the latch circuit 200 to the output buffer circuit 202 and also turns off the PMOS and NMOS transistors when the control signal C is input thereto.

The input control circuit 208 transmits a signal of the I/O port 1 and inhibits its operation when the control signal C is inputted thereto so that the output of the circuit 208 is fixed at a logic L level. The input buffer circuit 206 transmits an output signal of the input control circuit 208 to the bit line B3 when a read signal R is inputted thereto.

Figure 6:
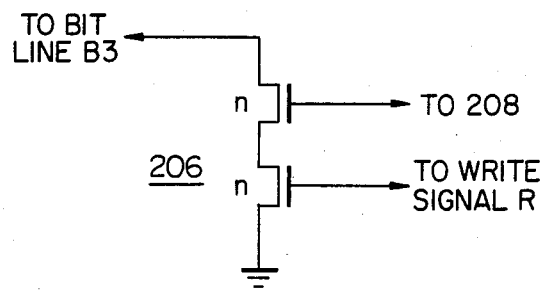
FIG. 6 is a circuit diagram of an embodiment of the input buffer circuit shown in FIG. 1.
Figure 7:
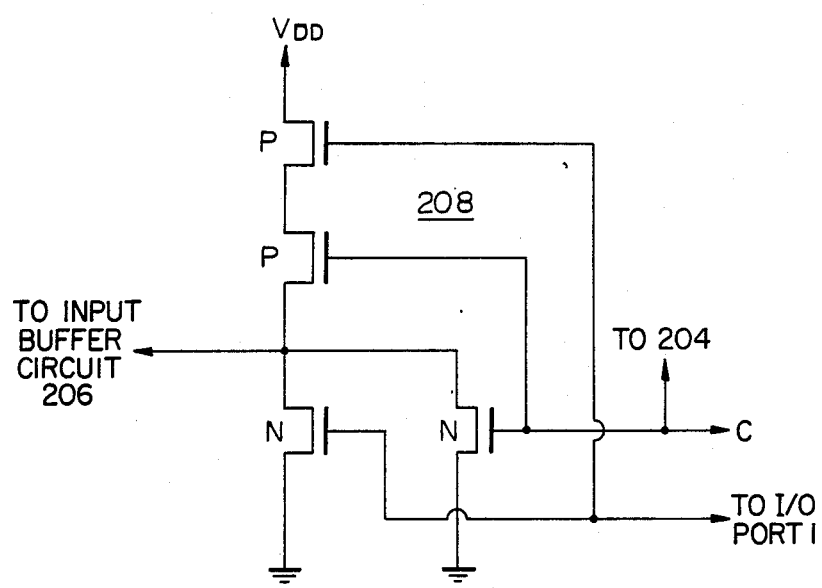
FIG. 7 is a circuit diagram of an embodiment of the input control circuit shown in FIG. 1.

In detail, the latch circuit 200 is a data type flip-flop circuit, and the output control circuit 204 comprises, for example, a CMOS inverter 210, a CMOS OR gate circuit 212 and a CMOS NOR gate circuit 214. The input buffer circuit 206, for example, comprises two N-MOS transistors connected in series as shown in FIG. 6. The input control circuit 208 comprises two P-MOS transistors and two N-MOS transistors as shown in FIG. 7. The two P-MOS transistors are serially connected, one P-MOS transistor being controlled by the control signal C to prevent a short circuit current from flowing through the control circuit 208.

The operation of the CMOS data input-output circuit 102 in accordance with the present invention will be described with reference to the timing charts shown in FIGS. 3(a)-(i) to FIGS. 5(a)-(i):

(1) Data Output Mode

Referring to FIGS. 3(a)-(i), a data output mode for transmitting data on the bit line B3 of the data bus 100 to the I/O port 1 is described. During a period of state S1, all logic levels of the bit line B3, the write signal W, the read signal R, the control signal C and the I/O port 1 are assumed to be a logic "L" level. During the period of state S2, the logic level of the bit line B3 turns to a logic "H" level. When the latch circuit 200 receives the write signal W for transmitting the "H" level signal of the bit line B3 to the I/O port 1, the latch circuit 200 holds the "H" level signal of the bit line B3 and immediately outputs a "H" level signal to the output control circuit 204. The output control circuit 204 supplies "L" level signals to the PMOS and NMOS transistors of the output buffer circuit 202 so that the CMOS output buffer circuit 202 transmits an "H" level signal to an external circuit through the I/O port 1.

(2) Data Input Mode

Referring to FIGS. 4(a)-(i), a data input mode is described for transmitting data on the I/O port 1 to the bit line B3. During the period of the state S1, all logic levels of the I/O port 1, the write signal W, the read signal R and the control signal C are assumed to be a logic "L" level and the logic level of the bit line B3 and the input buffer circuit 206 are assumed to be a logic "H" level. Because of the control signal C is an "L" level, the input control circuit 208 outputs an "H" level signal which inverts the "L" level signal being supplied from an external circuit to the I/O port to 1. During the period of state S2, when an "H" level read signal R is inputted, the input buffer circuit 206 outputs a logic "L" level signal to the bit line B3. The "L" level signal may be stored in a memory in the microprocessor. Accordingly, when an "L" level read signal R is subsequently inputted during the period of state S3, the bit line B3 becomes an "H" level.

(3) Power Down Mode

Referring to FIGS. 5(a)-(i), the operation of the CMOS data input-output circuit 102 in a power down mode is described. During the period of state S1, the write signal W, the read signal R and the control signal C are all assumed to be an "L" logic level; the logic level of the bit line B3 is assumed to be a logic "H" level and the logic level of a signal on the I/O port 1 is assumed to be an "H" or "L" level. During the period of state S2 (i.e.—the power down period), an "H" level control signal C is transmitted from a register (not shown) in microprocessor or a microcomputer is supplied to the output control circuit 204 and to the input control circuit 208. Since both PMOS and NMOS transistors in the output buffer circuit 202 turn off, the I/O port 1 becomes electrically floating (i.e.—electrically isolated).

Meanwhile, one P-MOS transistor of the input control circuit 208 is placed in an off condition by the control signal C, so that the circuit 208 is cut off completely in the power-down operation and is therefore not influenced by the logic state of the I/O port 1 (see FIG. 7).

The CMOS data input output circuit according to the present invention allows the I/O port to be directly connected to an external circuit, thus requiring no any interface means for the power-down mode of operation. Also, the CMOS data I/O circuit according to the present invention does not require any external pull-up or pull-down resistors for preventing the I/O port from being in a floating condition. Therefore, it is possible to reduce the number of elements forming an electronic system including a microprocessor.

Figure 8:
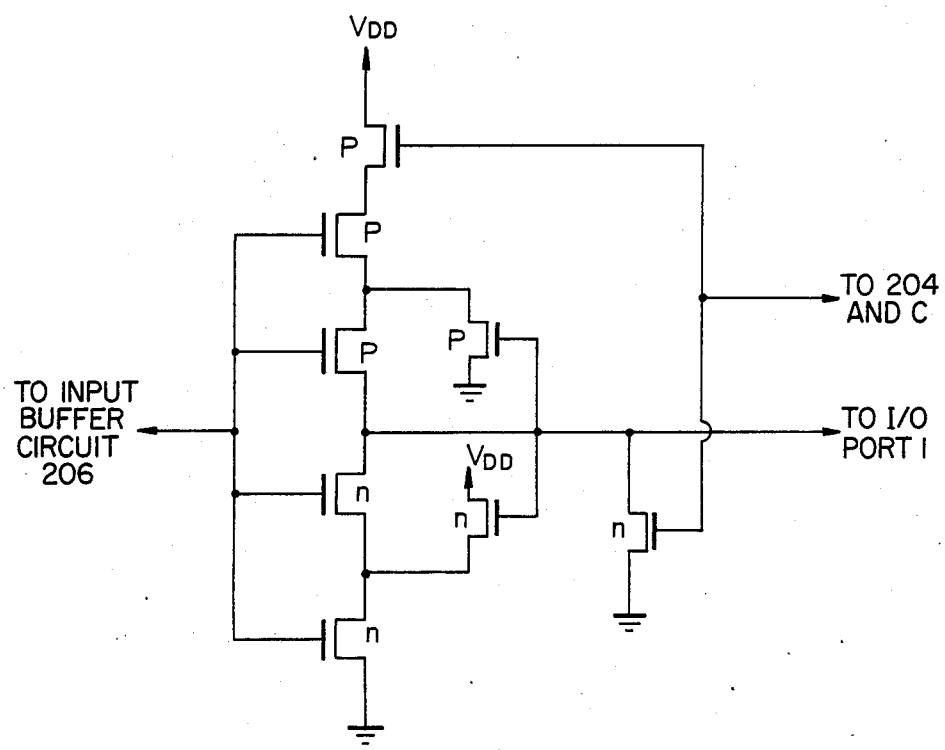
FIG. 8 is a circuit diagram of an input control circuit having a hysteresis characteristic.

In another embodiment of the present invention, a CMOS NOR gate circuit having a hysteresis characteristic as shown in FIG. 8 may be used as the input control circuit 208, so that high noise margin characteristics can be obtained with respect to logic level fluctuations of the I/O port 1 during normal operation. A CMOS OR circuit may also be used as the input control circuit 208. In this case, the output of the input control circuit is fixed at an H level in a power-down mode.

The CMOS data input-output circuit according to the present invention is particularly suitable for an I/O port circuit in CMOS microprocessors and microcomputers.

What is claimed is:

1. A CMOS data input-output circuit for controlling a bidirectional transmission of information between a data bus and an I/O port comprising:

a memory means connected to a bit line of said data bus for temporarily receiving information on said bit line of said data bus in response to a write signal;

a CMOS output buffer means including a P-MOS transistor and an N-MOS transistor which are serially connected, said P-MOS transistor having a gate and having a source connected to a power source and having a drain connected to said I/O port, said N-MOS transistor having a gate and having a source connected to a ground and having a drain connected to said I/O port;

an output control means having an output connected to the output of said memory means, and having a first output connected to said gate of said P-MOS transistor of said CMOS output buffer means and a second output connected to said gate of said N-MOS transistor of said CMOS output buffer means, and for placing said I/O port in an electrically floating condition when a control signal is input thereto;

an input buffer means having an input and having an output connected to said bit line of said data bus for selectively transmitting information on said I/O port to said bit line of said data bus in response to a read signal input thereto; and an input control means having an output connected to said input of said input buffer means, a first input connected to said I/O port and a second input for receiving said control signal; wherein an output of said input control means is fixed at a predetermined logic level when said control signal is inputted to said second input of said input control means during a power-down operation.

2. A CMOS circuit according to claim 1, wherein said memory means comprises: a latch circuit and said output control means comprising a OR gate circuit having a first input for receiving said control signal and having a second input and having an output connected to said gate of said P-MOS transistor of said CMOS buffer means; a NOR gate circuit having a first input for receiving said control signal and having a second input connected to the output of said memory means, and having an output connected to said gate of said N-MOS transistor and said CMOS buffer means; and an inverter connected between said second input of said OR gate circuit and said second input of said NOR gate circuit.

3. A CMOS circuit according to claim 1, wherein said input control means comprises a CMOS NOR gate circuit.

4. A CMOS circuit according to claim 1, wherein said input control means comprises a CMOS NOR gate circuit having a hysteresis characteristic.

5. A CMOS circuit according to claim 3, wherein said CMOS NOR gate circuit comprises first and second P-MOS transistors which are serially connected and disposed between said power source and said input of said input buffer circuit and further comprises first and second N-MOS transistors which are connected in parallel between said ground and said input of said input buffer circuit, gates of said first P-MOS and first N-MOS transistors being connected together so as to receive said control signal and gates of said second P-MOS and second N-MOS transistors being connected to said I/O port.

6. A CMOS circuit according to claim 4, wherein said CMOS NOR gate circuit comprises: first, second, and third P-MOS transistor which are serially connected and disposed between said power source and said I/O port; first and second N-MOS transistors which are serially connected between said ground and said I/O port; a fourth P-MOS transistor which is connected between said ground and a node between said second and third P-MOS transistors; a third N-MOS transistor which is connected between said power supply and a node between said first and second N-MOS transistors; and a fourth N-MOS transistor connected between said ground and said I/O port; wherein gates of said second and third P-MOS transistors and said first and second N-MOS transistors are connected to said input of said input buffer circuit and gates of said fourth P-MOS transistor and said third N-MOS transistor are connected to said I/O port and gates of said first P-MOS transistor and said fourth N-MOS transistor are connected together so as to receive said control signal.

* * * * *

UNITED STATES PATENT AND TRADEMARK OFFICE
CERTIFICATE OF CORRECTION

PATENT NO. : 4,680,491
DATED : July 14, 1987
INVENTOR(S) : Hiroshi YOKOUCHI et al.

It is certified that error appears in the above-indentified patent and that said Letters Patent is hereby corrected as shown below:

Column 2, line 11, change "output" (first occurrence) to --input--;

Column 5, line 19 (Claim 1), change "output" (second occurrence) to --input--.

Signed and Sealed this

Fourteenth Day of November, 1995

BRUCE LEHMAN

*Attest:*

*Attesting Officer*    *Commissioner of Patents and Trademarks*